United States Patent
Satoh et al.

(10) Patent No.: US 6,761,771 B2
(45) Date of Patent: Jul. 13, 2004

(54) SEMICONDUCTOR SUBSTRATE-SUPPORTING APPARATUS

(75) Inventors: Kiyoshi Satoh, Tama (JP); Hiroki Arai, Tama (JP)

(73) Assignee: ASM Japan K.K., Tama (JP)

( * ) Notice: Subject to any disclaimer, the term of this patent is extended or adjusted under 35 U.S.C. 154(b) by 0 days.

(21) Appl. No.: 09/982,454

(22) Filed: Oct. 17, 2001

(65) Prior Publication Data

US 2002/0162630 A1 Nov. 7, 2002

(30) Foreign Application Priority Data

Oct. 19, 2000 (JP) .................................... 2000-318994

(51) Int. Cl.[7] .......................... H01L 21/00; C23C 16/00
(52) U.S. Cl. ..................... 118/725; 118/723 E; 118/724
(58) Field of Search ................. 118/725, 724, 118/728; 279/128; 361/234; 156/345.53, 345.51

(56) References Cited

U.S. PATENT DOCUMENTS

| | | | |
|---|---|---|---|
| 4,986,215 A | * 1/1991 | Yamada et al. | 118/728 |
| 5,242,501 A | 9/1993 | McDiarmid | 118/728 |
| 5,439,524 A | 8/1995 | Cain et al. | 118/723 E |
| 5,494,522 A | 2/1996 | Moriya et al. | 118/719 |
| 5,688,331 A | * 11/1997 | Aruga et al. | 118/725 |
| 5,695,566 A | 12/1997 | Suzuki et al. | 118/723 E |
| 5,804,089 A | 9/1998 | Suzuki et al. | 216/71 |
| 5,891,251 A | * 4/1999 | MacLeish et al. | 118/719 |
| 5,925,226 A | 7/1999 | Hurwitt et al. | 204/298.15 |
| 5,990,016 A | 11/1999 | Kim et al. | 438/707 |
| 6,001,183 A | * 12/1999 | Gurary et al. | 118/720 |
| 6,035,101 A | * 3/2000 | Sajoto et al. | 392/416 |
| 6,074,518 A | * 6/2000 | Imafuku et al. | 156/345.46 |
| 6,094,334 A | * 7/2000 | Bedi et al. | 361/234 |
| 6,183,565 B1 | 2/2001 | Granneman et al. | 118/725 |
| 6,204,489 B1 | * 3/2001 | Katsuda et al. | 219/544 |

FOREIGN PATENT DOCUMENTS

| | | | | |
|---|---|---|---|---|
| JP | 59-50095 | | 3/1984 | |
| JP | 62-4315 | | 1/1987 | |
| JP | 01283813 A | * | 11/1989 | ......... H01L/21/205 |
| JP | 5-21520 | | 1/1993 | |
| JP | 9-320799 | | 12/1997 | |
| JP | 11-176593 | | 7/1999 | |
| JP | 11260534 A | * | 9/1999 | ........... H05B/03/20 |
| JP | 2001127142 A | * | 5/2001 | ........... H01L/21/68 |

OTHER PUBLICATIONS

U.S. patent application Ser. No. 09/531,254, Matsuki et al.

* cited by examiner

Primary Examiner—P. Hassanzadeh
Assistant Examiner—Michelle Crowell
(74) Attorney, Agent, or Firm—Knobbe Martens Olson & Bear LLP

(57) ABSTRACT

A substrate-supporting apparatus, wherein a substrate is not warped or distorted and a film with uniform thickness is formed, is a semiconductor substrate-supporting apparatus which supports and heats semiconductor substrates inside a vacuum-pumped reaction chamber. On the substrate-supporting surface of the semiconductor substrate-supporting apparatus, a concave portion which includes a depression slanting from the peripheral portion to the center is provided, the semiconductor substrate is supported in a position where the peripheral portion of the back surface of the substrate contacts the slanting surface of the concave portion, and the concave portion is formed so that an interval between the center of the concave portion and the semiconductor substrate becomes the designated distance. The slanting surface of the concave portion may include a portion of a spherical surface or a conical surface.

15 Claims, 2 Drawing Sheets

SEMICONDUCTOR SUBSTRATE-SUPPORTING APPARATUS

BACKGROUND OF THE INVENTION

1. Field of the Invention

The present invention relates to a semiconductor substrate-supporting apparatus which supports and heats semiconductor substrates inside a vacuum-pumped reaction chamber, and particularly relates to a semiconductor substrate-supporting apparatus which is characterized by the shape of the surface supporting the semiconductor substrate.

2. Description of the Related Art

Conventionally, using CVD equipment, silicon oxide, silicon nitride, insulation films such as polymers containing amorphous carbon or benzene nucleus, conductor films such as tungsten silicide, titanium nitride or aluminum alloy and highly-dielectric films including $PZT(PbZr_{1-x}Ti_xO_3)$ or BST $(Ba_xSr_{1-x}TiO_3)$ have been formed on silicon substrates or glass substrates.

To form these films, the low-pressure thermal CVD method and the plasma CVD method are generally used. In the low-pressure thermal CVD method, however, there is a problem that the electrical property of a semiconductor element changes by heat load and does not function as designed, because the semiconductor substrate is exposed to a high temperature above 700° C. As semiconductor apparatuses become more highly integrated in recent years, this heat load problem becomes increasingly serious. For this reason, the plasma CVD method, which reduces heat load to the substrate by processing the substrate at a low temperature, has become the mainstream method.

Generally in plasma CVD equipment, a substrate is heated and held at approximately 250° C. to 600° C. by a ceramic heater heated at 300° C. to 650° C. The ceramic heater also functions as a susceptor which directly supports the substrate. The ceramic heater is made by burying a resistance heating element and a radio-frequency electrode in the base substance comprising aluminum nitride (AlN). The radio-frequency electrode is embedded at a position which is approximately hundreds to thousands of $\mu$m deep from the heater top surface, which directly contacts the semiconductor substrate.

Conventionally, the following have been reported regarding the shapes of the surface of a ceramic heater: U.S. Pat. No. 5,231,690, U.S. Pat. No. 5,968,379 and Japanese Patent Laid-open No.2000-114354 disclose a ceramic heater whose surface is smoothly finished so that the surface of the ceramic heater and the back surface of the substrate perfectly contact. According to this, heat is efficiently conducted from the ceramic heater to the substrate. U.S. Pat. No. 5,306,895, Japan Patent No.2049039 and Japanese Patent Laid-open No.1995-238380 disclose a ceramic heater on whose surface a concave portion with a bore size smaller than the diameter of the substrate is formed and which contacts the back surface of the substrate only at the peripheral portion of the back surface of the substrate. According to this, because thermal conduction from the ceramic heater to the substrate is achieved only at the peripheral portion of the substrate, lowering the temperature at the peripheral portion of the substrate is prevented.

SUMMARY OF THE INVENTION

In the case of a ceramic heater whose surface is smoothly finished, because heat rapidly flows into the back surface of a substrate from the ceramic heater immediately after the substrate is placed onto the ceramic heater surface, only the back surface of the substrate expands, causing the substrate to warp. Due to this warping, thermal conduction from the ceramic heater rapidly decreases. It requires several minutes until the warping subsides and the substrate becomes flat. Additionally, it requires more time for the substrate to reach a desired temperature. As a result, it takes time until deposition starts after the substrate is placed onto the ceramic heater, and in the case of single-wafer-processing type semiconductor-manufacturing equipment, productivity is remarkably lowered. If the time for heating the substrate is shortened, because a film is formed in the state where the substrate has not reached the stated temperature, the film with the properties as designed is not obtained. If plasma is discharged while the substrate is warped and deposition is performed, plasma energy converges only on the peripheral portion of the substrate, which projects in the discharge space, and the film thickness becomes uneven across the entire substrate.

In the case of a ceramic heater on whose surface a concave portion with a bore size smaller than the diameter of the substrate is formed, because a rate of heat flowing in the substrate can be reduced due to thermal conduction to the substrate taking place only from the back surface of the peripheral portion of the substrate, warping of the substrate is prevented. If the bore of a concave potion is small, however, an area in which the ceramic heater surface and the back surface of the substrate contact becomes large and the contacting portion is rapidly heated locally and thermally expands. As a result, the entire substrate is deformed and warped. Conversely, if the bore of a concave potion is large and approaches the diameter of the substrate, the back surface of the substrate is not rapidly heated, but there is a risk that the end portion of the substrate may fall into the concave portion of the ceramic heater. If the substrate is placed off-center of the ceramic heater due to a position shift, etc., one end of the substrate falls into the concave portion and the substrate tilts with the opposite end projecting upward. If plasma processing is started in this position, abnormal convergence of the plasma energy (arc) occurs, normal plasma discharge cannot be maintained and a film with uneven thickness and abnormal properties is formed.

Consequently, the object of the present invention is to provide a substrate-supporting apparatus with which no warp or distortion of the substrate occurs and a film with even thickness is formed.

The second object of the present invention is to provide a substrate-supporting apparatus which heats a semiconductor substrate rapidly to a desired temperature and increases the productivity of semiconductor-manufacturing equipment.

The third object of the present invention is to provide a substrate-supporting apparatus which prevents abnormal plasma discharge and which provides stable deposition from a process point of view.

To achieve the above-mentioned objects, the semiconductor-supporting apparatus according to the present invention comprises the following structures in an embodiment:

A semiconductor substrate-supporting apparatus which supports and heats semiconductor substrates inside a vacuum-pumped reaction chamber, wherein on a substrate-supporting surface, a concave portion which comprises a depression slanting from the peripheral portion to the center is provided, the semiconductor substrate is held in a position where the peripheral portion of its back surface contacts the slanting surface of the concave portion, and the concave portion is formed so that an interval between the center of the concave portion and the semiconductor substrate becomes the designated distance.

Preferably, the slanting surface of the concave potion may be a portion of a spherical surface, but can be a conical surface as well.

Specifically, the designated interval between the center of the concave portion and the semiconductor substrate may be 0.05 mm to 0.3 mm.

Preferably, the semiconductor-processing equipment may possess a lip portion which protrudes in a ring-shape at its peripheral surface portion.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

In the figures, the symbols used indicate: 1: Plasma CVD equipment; 2: Reaction chamber; 3: Ceramic heater; 4: Showerhead; 5: Reaction gas inlet port; 6: Valve; 7: Reaction gas outlet port; 8, 8': Radio-frequency power source; 9: Semiconductor substrate; 10: Matching circuit; 11: Reaction gas inlet tube; 12: The bottom surface of the showerhead; 13: Ceramic base substance; 14: Ceramic heater surface; 15: Concave portion; 17: Piping; 18: Gate valve; 19: Opening; 20: Exhaust port; 21: Conductance adjusting valve; 22: Controller; 23: Pressure gauge; 25: Driving mechanism; 26: Resistance heating element; 27: Metal element; 28: Grounding; 29: Base; 30: Temperature controller.

DETAILED DESCRIPTION OF THE PREFERRED EMBODIMENT

Plasma CVD apparatuses are different from etching apparatuses. As compared with an etching apparatus wherein the processing pressure is usually in the range of 10–100 mTorr (1.33–13.3 Pa), the processing pressure of a plasma CVD apparatus is usually in the range of 3–10 Torr (399–1330 Pa). Thus, in the plasma CVD apparatus, the pressure is more than 100-fold of that of the etching apparatus, and thus, heat transfer by convection flow generated by the heater embedded in the susceptor is much more significant. This means that a gap between the susceptor and the substrate does not adversely affect heat transfer in the plasma CVD apparatus. Rather, the gap is advantageous to uniform heat transfer without warping. In the etching apparatus, heat conduction is critical to heating the substrate.

In connection with the above, the distance between an upper electrode and a lower electrode is approximately 5 to 40 mm in an embodiment of the present invention. Further, because heat transfer by convection flow is significant, no additional heating means is required. For example, unlike in etching apparatuses, the susceptor has no mechanism for ejecting gas from the center of the susceptor toward the back of the substrate. Further, no clamping mechanism for securing the substrate onto the susceptor is required because no gas ejecting mechanism is provided. The substrate is mounted on the susceptor without external mechanical force.

The present invention is described below referring to figures.

Figure 1:
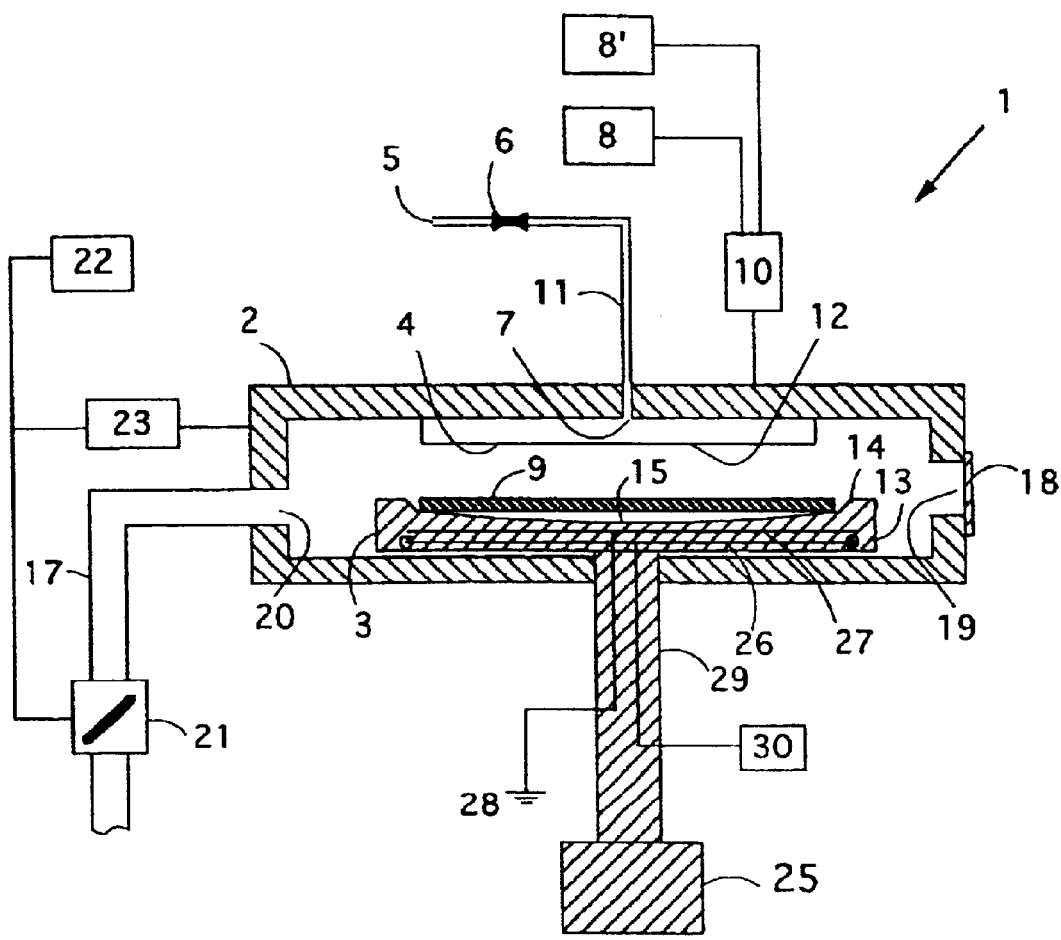
FIG. 1 shows a schematic cross section of the plasma CVD equipment, which includes the substrate-supporting apparatus according to the present invention.

FIG. 1 is a schematic cross section of a preferred example of plasma CVD equipment including the substrate-supporting apparatus according to the present invention. The plasma CVD equipment 1 for forming a thin film on a semiconductor substrate comprises a reaction chamber 2, a ceramic heater 3 for placing a semiconductor substrate 9 inside the reaction chamber 2, a showerhead 4 which is provided facing the ceramic heater 3 and is used for jetting out a reaction gas evenly on the semiconductor substrate 9, and an exhaust port 20 for exhausting air inside the reaction chamber 2.

At the side of the reaction chamber 2, an opening 19 is provided. The reaction chamber 2 is connected to a transfer chamber (not shown) for bringing in and carrying out the semiconductor substrate 9 through a gate valve 18.

Provided inside the reaction chamber 2, the ceramic heater 3 for placing the semiconductor substrate 9 comprises a ceramic base substance 13 manufactured by sintering. As a material for the ceramic base substance 13, ceramics such as a nitride which has durability against fluorinated or chlorinated active species or a ceramic which is an oxide or a fluoride can be mentioned. The ceramic base substance 13 preferably comprises aluminum nitride, but can be aluminum oxide, magnesium oxide, or magnesium fluoride. As described later in detail, the surface 14 of the ceramic heater 3 forms a concave portion 15 which comprises a depression slanting from the peripheral portion to the central portion. The substrate 9 is held in the position where the peripheral portion of its back surface line-contacts the slanting surface of the concave potion 15 of the ceramic heater 3. The concave portion 15 is formed so that an interval between the center of the concave portion 15 and the semiconductor substrate 9 becomes the designated distance. Through the base 29, the ceramic heater 3 is connected with a driving mechanism 25 for moving the ceramic heater 3 up and down.

Inside the ceramic heater 3, a resistance heating element 26 is embedded and is connected with an external power source (not shown) and a temperature controller 30. The heating element 26 is controlled by the temperature controller 30 to heat the ceramic heater 3 at the designated temperature (from 300° C. to 650° C.). As a material for the heating element 26, tungsten, a metal with a high melting point, is preferable.

A mesh and flat metal element 27, which forms a plasma discharge electrode, is embedded between the surface of the ceramic heater 3 and the heating element 26. Preferably this metal element 27 is grounded 28, and can also be connected with a radio-frequency power source. As a material for the metal element 27, tungsten, a metal with a high melting point, is preferable, but molybdenum can also be used.

Inside the reaction chamber, a showerhead 4 is provided in a position facing the above-mentioned ceramic heater 3. At the bottom surface 12 of the showerhead, thousands of pores (not shown) are provided for jetting out a reaction gas onto the substrate 9. The showerhead 4 is preferably electrically connected with radio-frequency power sources (8, 8') via a matching circuit 10 when a radio-frequency power source is connected with the metal element 27, the showerhead 4 can be grounded. The showerhead 4 forms the other electrode of the plasma discharge. Radio-frequency power sources (8, 8') generate different levels of radio-frequency power, 13.56 MHz and 300 to 450 kHz, respectively. These two different levels of radio-frequency power are composed inside the matching circuit 10 and are supplied to the showerhead 4. A reaction gas inlet tube 11 for bringing in a reaction gas is connected to the showerhead 4. A number of inlet tubes corresponding to the types of reaction gases can be provided. These inlet tubes are connected to the showerhead by integrating them into one gas inlet tube. One end of the reaction gas inlet tube 11 forms a reaction gas inlet port 5 for bringing in the reaction gas, and the other end forms a reaction gas outlet port 7 for letting the gas flow out to the showerhead. In the middle of the reaction gas inlet tube, a mass flow controller (not shown) and a valve 6 is provided.

Inside the reaction chamber 2, an exhaust port 20 is provided. The exhaust port 20 is connected to a vacuum pump (not shown) through piping 17. In the middle of the exhaust 20 and the vacuum pump, a conductance-adjusting valve 21 for adjusting pressure inside the reaction chamber 2 is provided. The conductance-adjusting valve 21 is electrically connected with an external controller 22. Preferably a pressure gauge 23 for measuring pressure inside the reaction chamber is provided and is electrically connected with the controller 22.

Figure 2:
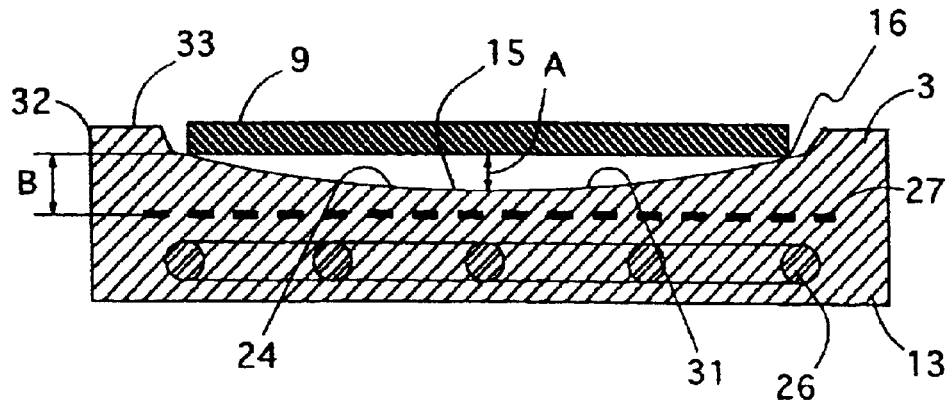
FIG. 2 shows an enlarged view of the substrate-supporting apparatus shown in FIG. 1.

The ceramic heater 3 is described below. FIG. 2 is an enlarged view of the ceramic heater 3 used in FIG. 1. The ceramic heater 3 according to the present invention preferably comprises a columnar ceramic base substance 13 of 220 mm to 250 mm in diameter and 15 mm to 25 mm in thickness for a 200 mmφ substrate, or 310 mm to 350 mm in diameter and 15 mm to 35 mm in thickness for a 300 mmφ substrate, and a concave portion 15 comprising a depression is provided in a substrate-supporting surface 31. The concave portion 15 comprises a slanting surface 24, which slants from the peripheral portion to the central portion of the substrate-supporting surface 31. Preferably the slanting surface 24 comprises a portion of a sphere of approximately 51,000 mm in radius of curvature for a 200 mmφ substrate or approximately 56,000 mm in radium of curvature for a 300 mmφ substrate, but a sphere with a radius of curvature other than this size can also be used. The semiconductor substrate 9 contacts the ceramic heater at the peripheral portion of its back surface. Consequently, contact of the semiconductor substrate 9 and the ceramic heater is line contact. The Distance A between the semiconductor substrate 9 and the center of the substrate-supporting surface 31 is 0.05 mm to 0.3 mm, preferably 0.1 mm to 0.2 mm for both 200 mmφ and 300 mmφ substrates. By changing a radius of curvature according to the diameter of a substrate to be processed, it is possible to maintain the Distance A at the stated value.

At the peripheral portion of the back surface of the ceramic heater 3, a ring-shaped lip 32 is provided as if surrounding the semiconductor substrate 9. The top surface 33 of the lip 32 and the surface of the semiconductor substrate 9 are formed so as to be of equal height. This is with a view to preventing plasma from converging on either one of them by making plasma potential from the showerhead the same potential.

The above-mentioned heating element 26 and the metal element 27 are embedded in the ceramic heater 3. The metal element 27, which forms one of the radio-frequency electrodes, is embedded at the position which is "B in depth" from a contact point of the substrate-supporting surface 31 with the substrate 9. The depth B is 0.5 mm to 2 mm, preferably 0.7 mm to 1.2 mm.

Figure 3:
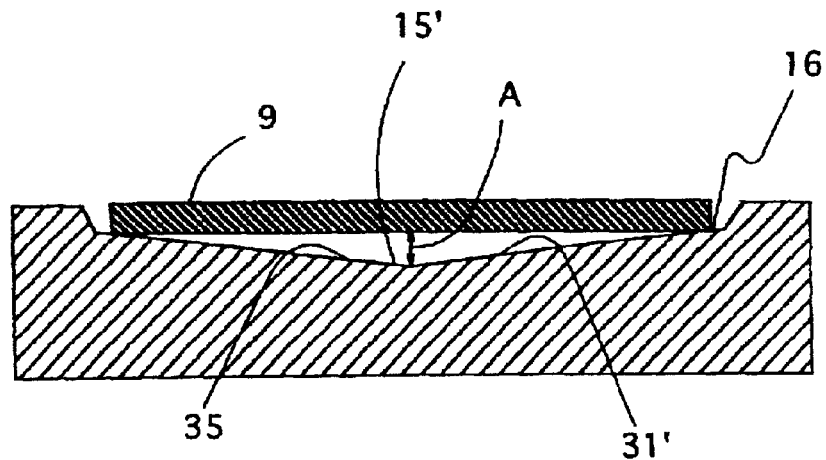
FIG. 3 shows the second example of the substrate-supporting apparatus according to the present invention.

FIG. 3 shows another example of the ceramic heater 3 according to the present invention. A point different from the example shown in FIG. 2 is that a substrate-supporting surface 31' possesses a concave portion 15' comprising a conical depression 35. A semiconductor substrate 9 contacts the ceramic heater only at the peripheral portion 16 of the back surface of the substrate. The distance A between the semiconductor substrate 9 and the center of the concave portion 15' is the same as that of the example shown in FIG. 2.

Figure 4:
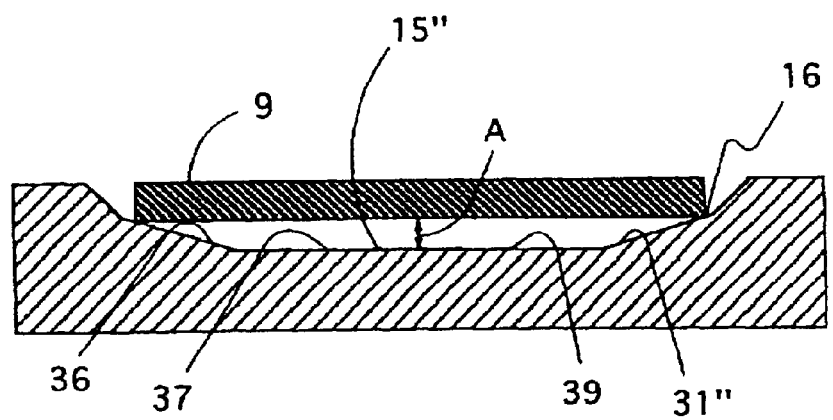
FIG. 4 shows the third example of the substrate-supporting apparatus according to the present invention.

FIG. 4 shows a third example of the ceramic heater according to the present invention. A point different from the example shown in FIG. 2 is that a substrate-supporting surface 31' possesses a concave portion 15' comprising a depression 39 comprising a slanting portion 36 and a flat portion 37. The slanting portion 36 is preferably a portion of a conical surface, but can be a portion of a spherical surface. The semiconductor substrate 9 contacts the slanting portion 36 only at the peripheral portion 16 of the back surface of the substrate. The Distance A between the semiconductor substrate 9 and the flat portion 37 is the same as that of the example shown in FIG. 2. According to this example, when the semiconductor substrate is a large diameter, approximately 300 mm, and even if the Distance A is made smaller, the inclination of the slanting portion 36 can be made relatively steeper.

Figure 5:
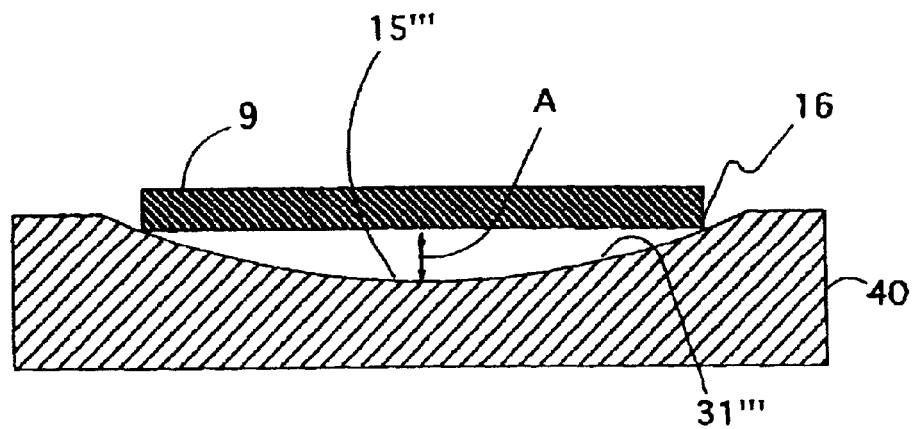
FIG. 5 shows a transformed example of the substrate-supporting apparatus according to the present invention.

FIG. 5 shows a fourth example of the ceramic heater 3 according to the present invention. The ceramic heater 40 shown in FIG. 5 was designed for low-pressure thermal CVD equipment. Consequently, a lip portion for preventing plasma convergence is not provided. Preferably, a substrate-supporting surface 31''' possesses a concave portion 15''' comprising a spherical depression. The concave portion 15''' can comprise a conical surface. The semiconductor substrate 9 contacts the substrate-supporting surface 31''' only at the peripheral portion 16 of the back surface of the substrate. The Distance A between the semiconductor substrate 9 and the concave portion 15''' is the same as that of the example shown in FIG. 2.

EXAMPLES

Experiment results of forming a silicon nitride film on a semiconductor substrate using plasma CVD equipment shown in FIG. 1 are shown below.

The ceramic heater 3 was maintained at 600° C. by the resistance heating element 26, and the semiconductor substrate 9 was heated at a temperature from 540° C. to 550° C. A mixed gas of $SiH_4$ gas and $N_2$ gas was brought in from the piping 5, and a reaction gas was jetted out from the showerhead 4 to the semiconductor substrate 9. The internal pressure inside the reaction chamber 2 was controlled within the specific limits of 4 to 9 Torr based on pressure measured by the pressure gauge 23 by controlling the aperture degree of the conductance adjusting valve 21 by the controller 22. By applying radio-frequency power of 13.56 MHz and 400W to the showerhead 4 through the matching circuit 10, a plasma discharge area was formed between the showerhead 4 and the ceramic heater 3.

As a result of this experiment, a silicon nitride film of 100 nm thickness was formed on the semiconductor substrate in one minute. In approximately 20 seconds after the semiconductor substrate was placed on the ceramic heater, formation of the silicon nitride film was able to be started. The amount of scatter in film thickness in the entire semiconductor substrate was below ±1.5% (a percentage of a value obtained by subtracting the minimum value from the maximum value and dividing one half of the remainder by the mean), and it was found that a highly uniform film was obtainable using the ceramic heater according to the present invention.

EFFECTS

According to the semiconductor substrate-supporting apparatus according to the present invention, because heat flows in only from the outermost periphery of the semiconductor substrate and moves toward the center since only the peripheral portion of the back surface of the semiconductor substrate line-contacts the slanting portion of the concave portion of the ceramic heater, no warping or distortion of the substrate occurs, and deposition of uniform film thickness was able to be achieved.

According to the semiconductor substrate-supporting apparatus according to the present invention, no warping or distortion of the substrate occurs because only the peripheral portion of the back surface of the semiconductor substrate line-contacts the slanting portion of the concave portion of the ceramic heater. Because heat rapidly moves from the outermost periphery of the semiconductor substrate to the center, the semiconductor substrate was rapidly heated to the desired temperature and the productivity of the semiconductor-manufacturing equipment was able to be improved.

Furthermore, according to the semiconductor substrate-supporting apparatus according to the present invention, because only the peripheral portion of the back surface of the semiconductor substrate line-contacts the slanting portion of the concave portion of the ceramic heater and the lip portion is formed in the peripheral portion of the surface, misalignment of a semiconductor substrate and abnormal plasma discharge are prevented and stable deposition from a process point of view was able to be achieved.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A semiconductor substrate-supporting apparatus for supporting and heating a single semiconductor substrate inside a vacuum-pumped reaction chamber, comprising:
   a substrate-supporting surface having a concave portion including a depression slanting toward the center of the substrate-supporting surface, wherein only a peripheral portion of the back surface of the substrate, when loaded, contacts the slanting surface of the concave portion;
   a surface peripheral portion formed around the substrate-supporting surface, said surface peripheral portion having a lip portion which protrudes in a ring shape, said lip portion having a top surface and a slanted inner side surface continuing from the top surface and extending to the substrate-supporting surface to prevent a plasma from converging on either the lip portion or the substrate, said top surface being configured to be of substantially the same height as a top surface of the substrate when loaded, said inner slanted side surface being slanted outward at an angle greater than the substrate-supporting surface at a position contacting the substrate when loaded;
   a heating element embedded below the concave portion;
   a radio-frequency electrode of a metal element embedded below the concave portion; and
   no mechanical mechanism to clamp the substrate on the substrate-supporting surface.

2. The apparatus as claimed in claim 1, wherein said slanting surface is a portion of a spherical surface.

3. The apparatus as claimed in claim 1, wherein said slanting surface is a conical surface.

4. The apparatus as claimed in claim 1, wherein said concave portion comprises a slanting portion and a flat portion.

5. The apparatus as claimed in claim 1, wherein the distance between the back surface of the substrate and the center of the concave surface is 0.05 mm to 0.3 mm.

6. The apparatus as claimed in claim 1, wherein the radio-frequency electrode of a metal element is embedded above said heating element.

7. The apparatus as claimed in claim 1, which is adapted to be installed in a plasma CVD apparatus.

8. A plasma CVD apparatus, comprising:
   a vacuum-pumped reaction chamber;
   a semiconductor substrate-supporting apparatus for supporting and heating a single semiconductor substrate inside the vacuum-pumped reaction chamber, said substrate-supporting apparatus comprising:
   (i) a substrate-supporting surface having a concave portion including a depression slanting toward the center of the substrate-supporting surface, wherein only a peripheral portion of the back surface of the substrate, when loaded, contacts the slanting surface of the concave portion;
   (ii) a surface peripheral portion formed around the substrate-supporting surface, said surface peripheral portion having a lip portion which protrudes in a ring shape, said lip portion having a top surface and a slanted inner side surface continuing from the ton surface and extending to the substrate-supporting surface to prevent a plasma from converging on either the lip portion or the substrate, said top surface being configured to be of substantially the same height as a top surface of the substrate when loaded, said inner slanted side surface being slanted outward at an angle greater than the substrate-supporting surface at a position contacting the substrate when loaded;
   (iii) a heating element; and
   (iv) no mechanical mechanism to clamp the substrate on the substrate-supporting surface.

9. The apparatus as claimed in claim 8, wherein said slanting surface is a portion of a spherical surface.

10. The apparatus as claimed in claim 8, wherein said slanting surface is a conical surface.

11. The apparatus as claimed in claim 8, wherein said concave portion comprises a slanting portion and a flat portion.

12. The apparatus as claimed in claim 8, wherein the distance between the back surface of the substrate and the center of the concave surface is 0.05 mm to 0.3 mm.

13. The apparatus as claimed in claim 8, wherein the heating element is embedded below said concave portion.

14. The apparatus as claimed in claim 13, wherein said substrate-supporting apparatus further comprises a radio-frequency electrode of a metal element embedded below said concave portion and above said heating element.

15. A semiconductor substrate-supporting apparatus for supporting and heating a single flat semiconductor substrate inside a vacuum-pumped reaction chamber, comprising:

a substrate-supporting surface comprising a concave portion with a depression slanting toward the center of the substrate-supporting surface, wherein a peripheral portion of the back surface of the flat substrate when loaded, contacts the slanting surface of the concave portion;

a lip portion protruding in a ring shape formed around the substrate-supporting surface, said lip portion being configured to prevent a plasma from converging on either the lip portion or the substrate, said lip portion having a top surface and a slanted inner side surface connecting the top surface and the slanting surface of the substrate-supporting surface, said top surface being configured to be of substantially the same height as a top surface of the substrate when loaded, said inner slanted side surface being continuously slanted outward at an angle greater than the slanting surface of the substrate-supporting surface at a position contacting the substrate when loaded;

a heating element embedded below the concave portion;

a radio-frequency electrode of a metal element embedded below the concave portion; and no mechanical mechanism to clamp the substrate on the substrate-supporting surface.

* * * * *